(12) United States Patent
Boerger et al.

(10) Patent No.: US 11,658,484 B2
(45) Date of Patent: May 23, 2023

(54) METHOD AND APPARATUS FOR OPERATING ELECTRICAL DEVICES IN MUTUALLY COORDINATED FASHION

(71) Applicant: SMA Solar Technology AG, Niestetal (DE)

(72) Inventors: Stefan Boerger, Kassel (DE); Andreas Strusch, Fuldatal (DE); Dirk Schlote, Kassel (DE); Matthias Groene, Kassel (DE); Raimund Thiel, Bad Zwesten (DE); Rachel Anne Hegemann, Darmstadt (DE)

(73) Assignee: SMA Solar Technology AG, Niestetal (DE)

( * ) Notice: Subject to any disclaimer, the term of this patent is extended or adjusted under 35 U.S.C. 154(b) by 20 days.

(21) Appl. No.: 17/079,828

(22) Filed: Oct. 26, 2020

(65) Prior Publication Data
US 2021/0044114 A1     Feb. 11, 2021

Related U.S. Application Data

(63) Continuation of application No. PCT/EP2019/060713, filed on Apr. 26, 2019.

(30) Foreign Application Priority Data

Apr. 26, 2018 (DE) .......................... 102018110044.2

(51) Int. Cl.
*H02J 3/14* (2006.01)
*H02J 3/00* (2006.01)
(Continued)

(52) U.S. Cl.
CPC .............. *H02J 3/14* (2013.01); *G01R 21/133* (2013.01); *H02J 3/003* (2020.01); *H02J 3/381* (2013.01);
(Continued)

(58) Field of Classification Search
USPC ........................................................ 700/295
See application file for complete search history.

(56) References Cited

U.S. PATENT DOCUMENTS

2011/0251807 A1\* 10/2011 Rada ......................... G01D 4/00
702/61
2012/0278272 A1\* 11/2012 Kim ..................... G06F 11/3013
706/52
(Continued)

FOREIGN PATENT DOCUMENTS

JP          6144842 B1     6/2017
WO     2011045184 A1     4/2011

OTHER PUBLICATIONS

International Search Report dated Jul. 17, 2019 in connection with PCT/EP2019/060713.

*Primary Examiner* — Emilio J Saavedra
(74) *Attorney, Agent, or Firm* — Eschweiler & Potashnik, LLC

(57) ABSTRACT

To operate electrical devices, power consumptions of all the electrical devices are continually captured and assigned to the individual electrical devices and at least one desired result is achieved by virtue of at least a first control instance of the electrical devices, the operation of which helps to achieve a desired result, and a second control instance of the electrical devices, the operation of which likewise helps to achieve the desired result. The devices are operated in a coordinated fashion. To this end, measured values from multiple measured value transmitters are captured by operating the multiple electrical devices. Correlations between changes in the measured values of the individual measured value transmitters over time and changes in the power consumptions of the individual electrical devices over time are determined and the desired result is selected from a subgroup of results.

13 Claims, 3 Drawing Sheets

(51) Int. Cl.
*G01R 21/133* (2006.01)
*H02J 3/38* (2006.01)
(52) U.S. Cl.
CPC ....... *H02J 2203/20* (2020.01); *H02J 2310/14* (2020.01); *Y04S 20/242* (2013.01)

(56) References Cited

U.S. PATENT DOCUMENTS

| | | | |
|---|---|---|---|
| 2013/0131883 A1* | 5/2013 | Yamada | H02J 13/0075 700/295 |
| 2014/0046495 A1 | 2/2014 | Magnussen | |
| 2015/0355246 A1 | 12/2015 | Choe | |
| 2015/0369253 A1 | 12/2015 | Ragupathi | |
| 2016/0349725 A1 | 12/2016 | Miura | |
| 2017/0269653 A1 | 9/2017 | Shabbir | |
| 2017/0264095 A1 | 11/2017 | Rombouts | |
| 2018/0262008 A1 | 9/2018 | Terauchi | |
| 2018/0321288 A1 | 11/2018 | Kitajima | |

\* cited by examiner

METHOD AND APPARATUS FOR OPERATING ELECTRICAL DEVICES IN MUTUALLY COORDINATED FASHION

CROSS REFERENCE TO RELATED APPLICATIONS

This application is a continuation of International Patent Application number PCT/EP2019/060713, filed on Apr. 26, 2019, which claims priority to German Patent Application number 10 2018 110 044.2, filed on Apr. 26, 2018, and is hereby incorporated by reference in its entirety.

FIELD

The disclosure relates to a method for operating electrical devices in mutually coordinated fashion. Additionally, the disclosure relates to an apparatus for performing such a method.

BACKGROUND

Local energy management opens up various opportunities. Just merely documenting the power consumption broken down according to individual electrical devices uncovers reasons for costs and hence also potentials for saving. Accordingly, documenting the supply of electric power by local electricity generators, such as, for example, wind and solar generators, shows opportunities for income by means of electricity sales and optimization potentials in regard to a local consumption of the locally generated electric power, also referred to as own consumption. Such potentials for saving and optimizations of own consumption can then be realized directly if the energy management can at least impact on individual electrical devices. For comprehensive energy management, however, the power consumptions of, where possible, all locally present electrical devices need to be captured and assigned to the individual electrical devices. This normally causes a high level of installation complexity for the energy management. Electrical devices that the energy management cannot influence directly in order to influence their power consumption also need to be connected, at least so that their power consumptions can be documented and assigned.

WO 2012/136836 A1 discloses the practice of optimizing a time course of a consumption of electric power by a group of different consumers with respect to a supply of electric power that comprises electric power from at least one wind or solar electricity generator. The optimization is performed by capturing characteristic time courses of a consumption of electric power by the individual consumers and opportunities for intervention in the present consumption of electric power by the individual consumers with a high level of time resolution. A forecast for a period in the future is created for the time course of the supply of electric power by the at least one electricity generator. In line with the forecast, a schedule for the allocation of electric power to the individual consumers is created for the period in the future. The characteristic time courses of the consumption of electric power by the individual consumers can be determined from an overall consumption. The characteristic time course of the consumption can be used as an identifying fingerprint of the respective consumer, in order to download information concerning the respective consumer from a database. In cases in which an identical desired result to that for one of the consumers or electricity generators present can also be achieved by another consumer or electricity generator that is present or another device that is present, for example, if a heating power for heating water can be provided either by burning a fuel or by converting electric power into heating power or if electric power can be provided by different fuel-operated generators and/or a battery, a further forecast for the time course of conditions for an alternative provision of an identical result by another consumer or electricity generator that is present or another device that is present is created for the period in the future, which is taken into consideration when creating the schedule for allocating electric power to the individual consumers over the period in the future.

SUMMARY

The disclosure is directed to a method and an apparatus for operating electrical devices in mutually coordinated fashion that realize potentials for energy saving with little installation complexity.

A method according to the disclosure for operating electrical devices, wherein power consumptions of all the electrical devices are continually captured centrally is disclosed. The power consumptions are assigned to the individual electrical devices and at least one desired result is achieved by virtue of at least a first instance of the electrical devices, the operation of which at least contributes to achieve the at least one of the desired results, and a second instance of the electrical devices, the operation of which likewise at least contributes to achieve the at least one of the desired results, are operated in centrally mutually coordinated fashion. The method involves measured values from multiple measured value transmitters that record results that are achieved by operating the multiple electrical devices being captured centrally. Correlations between changes in the measured values of the individual measured value transmitters over time and changes in the power consumptions of the individual electrical devices over time are likewise determined centrally. The at least one desired result is then selected from a subgroup of results, which, firstly, are recorded by the measured value transmitters and for which, secondly, the correlations between the changes in the measured values from at least one of the individual measured value transmitters over time and the changes in the power consumptions of at least two of the individual electrical devices over time reach a first predetermined minimum correlation value.

In one embodiment the acts of the method according to the disclosure that are described here are executable fully automatically. This fully automatic execution can replace, or at least considerably simplify, substantial portions of a complex installation of an apparatus for performing the method. This includes the circumstance that, if the centrally continually captured power consumptions of all the electrical devices are not individually linked to the applicable electrical devices from the outset, the assignment of the power consumptions to the individual electrical devices according to the disclosure includes automatable determination of these links. The operation of multiple electrical devices in mutually coordinated fashion according to the disclosure in order to achieve the at least one desired result is also performed, according to the disclosure, such that it is fully automatable. This requires measured value transmitters to be present that record results achieved by operating the multiple electrical devices. As a result of the measured values from these measured value transmitters being captured centrally and the correlations between changes in the measured values over time and changes in the power consumptions of the individual electrical devices over time likewise being determined centrally, the links between the measured value transmitters and the individual electrical devices are automatically determinable. By quantifying the correlations and comparing them with the first predetermined minimum correlation value, it is additionally possible to automatically determine which electrical devices are reasonably operated in mutually coordinated fashion in order to achieve which desired result. This aspect of the present disclosure goes beyond the mere installation of the apparatus and defines an automatable optimization of the operation of the electrical devices using the apparatus. The correlation determined according to the disclosure is a degree of interrelation determined from the measured values of the respective measured value transmitter and the power consumptions of the respective electrical device according to the rules of statistics. This degree of interrelation may be a known correlation coefficient or else calculated in another manner. It goes without saying that the minimum correlation value with which the calculated correlation is compared needs to be coordinated with the definition of the correlation. In one embodiment, the only critical factor is that the definition of the correlation permits the automatable calculation of a degree of an interrelation between the changes in the measured values of the respective measured value transmitters over time and the changes in the power consumptions of the respective electrical device over time, which is then comparable with the first predetermined minimum correlation value. The automatability of the operation of multiple electrical devices in mutually coordinated fashion, according to the disclosure, in order to achieve a result identified by means of the correlations presupposes possibilities for the apparatus used for this purpose to intervene in the respective electrical devices. If these possibilities for intervention are not available from the outset, they can be created by modifications in the control units of the electrical devices or by using additional power control devices, for example.

The method according to the disclosure can involve determining and taking into consideration dependencies on the measured values of other measured value transmitters that exist for the determined correlations between the changes in the measured values of the individual measured value transmitters over time and the changes in the power consumptions of the individual electrical devices over time. In many cases, the correlations determined according to the disclosure are not rigid, but rather dependent on environmental parameters. As such, for example, a room temperature of a room captured using a measured value transmitter can rise during the operation of an electrical device arranged in a neighbouring room on the basis of whether or not a door arranged between the room and the adjoining room is open. If a measured value transmitter detects the open state of the door, the influence of opening the door on the influence of the operation of the electrical device in the neighbouring room on the room temperature in the room of interest can be taken into consideration. Possible parameters other than the open state of a door for effects of the operation of an electrical device on a room temperature can be humidity, the absolute room temperature in the room, an outside temperature, an open state of other doors, and the like. By looking at correlations, these influences can all be determined automatically. There may be a need for a larger number of events in order to determine the correlations of interest with sufficient accuracy, in particular if the correlations of interest are dependent on many environmental parameters. There may also be a need for a multiplicity of computing operations in order to identify these dependencies. Usually, however, a sufficiently long period of between many hours and a few weeks is also available for this purpose, said period needing to elapse anyway so that the necessary number of events required for determining the correlations is available.

The method according to the disclosure can involve the individual power consumptions being used to infer the type of the associated individual electrical devices. The method according to the disclosure can thus involve in particular the time course of the respective power consumption being used as an identifying fingerprint of the respective electrical device in a fundamentally known manner. In particular correlations between the captured power consumptions and power consumptions of known types of electrical devices can be determined and compared among one another and, additionally or alternatively, in each case with a second predetermined minimum correlation value. The highest correlation exceeding the second predetermined minimum correlation value at the same time can then be used as an indication of the type of the respective electrical device, for example.

Additionally, the method according to the disclosure can involve the correlations between the changes in the measured values of the individual measured value transmitters over time and the changes in the power consumptions of the individual electrical devices over time being used to infer an, in particular, spatial association of the individual measured value transmitters with the individual electrical devices. Alternatively or additionally, these correlations can be used to infer a type of the individual measured value transmitters and/or the events recorded by the individual measured value transmitters. By way of example, temperature sensors as measured value transmitters are usually characterized in that they output a measured value that increases with a time delay in relation to the respective power consumption. The time delay is dependent on the spatial association of the measured value transmitter with the electrical device having the power consumption and the resultant thermal coupling. The course of the measured value also permits conclusions about the respective measured value transmitter. As such, a room temperature captured using a room temperature sensor rises in a different typical range from the temperature of a cooling liquid in a cooling circuit. The measured value of a temperature sensor in an area cooled by an electrical device, on the other hand, indicates temperatures that fall with a power consumption of this electrical device. Measured value transmitters for electrical variables, such as, for example, voltage and reactive power, respond to a power consumption of a respective electrical device in a very much shorter time than temperature sensors. If all available information, such as the absolute magnitude of the measured value and the direction, the time and the extent of the changes in the measured value as a result of the power consumption of the respective electrical device, and also the correlations of the changes in the measured value with the power consumptions of different electrical devices and measured values of other measured value transmitters are taken into consideration, a sufficiently accurate conclusion about the type of the measured value transmitter and the event recorded by it is possible in many cases. This information can be evaluated, in particular, by matching it against databases storing applicable empirical values.

It is frequently found to be expedient for the method according to the disclosure, in order to identify correlations of interest with little effort, if the central determination of the correlations between the changes in the measured values of the individual measured value transmitters over time and the changes in the power consumptions of the individual electrical devices over time involves specifically such changes in the measured values of the individual measured value transmitters over time that fulfill a predetermined minimum delay and/or a predetermined maximum delay in comparison with the changes in the power consumptions over time being taken into consideration. As was already indicated, many correlations of interest, such as, for example, changes in temperatures, result in a time delay arising for the changes in the measured values in comparison with the changes in the power consumptions, which is caused by different effects such as thermal conductivity, convection and the like. Since the extent of this time delay is not known from the outset, it is necessary to look for the correlations with different time delays. As a result, these time delays are for their part determined when the method according to the disclosure is performed, and can be taken into consideration for operating the electrical devices in mutually coordinated fashion. The limitation of the time delays to a specific time window limits the computation complexity required for determining the correlations. The predetermined maximum delay in this case admittedly means that correlations possibly present with a longer delay are not detected. However, these usually can also not be exploited in a purposeful manner, if multiple electrical devices whose power consumptions are correlated with the measured value are operated in mutually coordinated fashion in order to achieve a desired result. Depending on the type of the event of interest, the predetermined minimum delay can also be used to limit the computation complexity. If the result is for example the setting of a specific reactive power or of a specific phase angle between current and voltage, however, then the use of a predetermined minimum delay of greater than zero is less useful. In this case, however, the predetermined maximum delay can be set relatively short and thus the computation complexity can be limited.

The method according to the disclosure can involve the determined correlations between the changes in the measured values of the individual measured value transmitters over time and the changes in the power consumption of the individual electrical devices over time being monitored for changes. These changes particularly do not refer to changes dependent on changing environmental conditions being detectable using other, suitable measured value transmitters. Instead, the area of interest here is, in particular, such changes in the determined correlations as indicate changing properties of the electrical devices and/or of the measured value transmitters that are indications of already existent or impending faults or impaired functionalities. As such, changes that reach a predetermined level of significance can result in an inspection suggestion being provided for the respective individual electrical device or the individual measured value transmitter.

As was already indicated, the at least one desired result, for which, according to the disclosure, suitable correlations are initially determined and which is then achieved by operating multiple electrical devices in mutually coordinated fashion, can be selected from a subgroup of results that comprise a raising, a lowering or a setting of a temperature, a pressure and/or a reactive power.

A byproduct of the method according to the disclosure can be an updating of a graphical representation of the electrical devices, into which the determined correlations and/or spatial associations derivable therefrom are entered.

An apparatus according to the disclosure having a data input for connecting at least one power consumption signal and measured value transmitters and having a control input for controlling multiple electrical devices is designed, according to the disclosure, to perform the method according to the disclosure. That is to say that the apparatus usually has an appropriately programmed processor or controller.

Advantageous developments of the disclosure emerge from the patent claims, the description and the drawings. The advantages cited in the description for features and combinations of multiple features are merely examples and can take effect alternatively or cumulatively without the advantages necessarily needing to be achieved by embodiments according to the disclosure. Without this altering the subject matter of the appended patent claims, the following applies in respect of the disclosure content of the original application documents and the patent: further features are evident from the drawings—in particular the depicted geometries and the relative dimensions of multiple subassemblies in relation to one another and also the relative arrangement and operative connection thereof. The combination of features of different embodiments of the disclosure or of features of different patent claims is likewise possible as a departure from the chosen dependency references of the patent claims and is suggested hereby. This also relates to such features as are depicted in separate drawings or are mentioned in the description thereof. These features can also be combined with features of different patent claims. Similarly, features presented in the patent claims can be dropped for further embodiments of the disclosure.

The features cited in the patent claims and the description should be understood in respect of their number such that precisely this number or a greater number than the cited number is present, without explicit use of the adverb "at least" being required. That is to say that if the text refers to an inspection suggestion, for example, then this should be understood to mean that precisely one inspection suggestion, two inspection suggestions or more inspection suggestions are provided. The features indicated in the patent claims can be supplemented by other features or may be the only features that the respective method or the respective apparatus has.

The reference signs that the patent claims contain are not a restriction for the scope of the subjects protected by the patent claims. They merely serve the purpose of making the patent claims more easily comprehensible.

BRIEF DESCRIPTION OF THE FIGURES

The disclosure is explained and described in more detail below on the basis of embodiments depicted in the figures.

DETAILED DESCRIPTION

Figure 1:
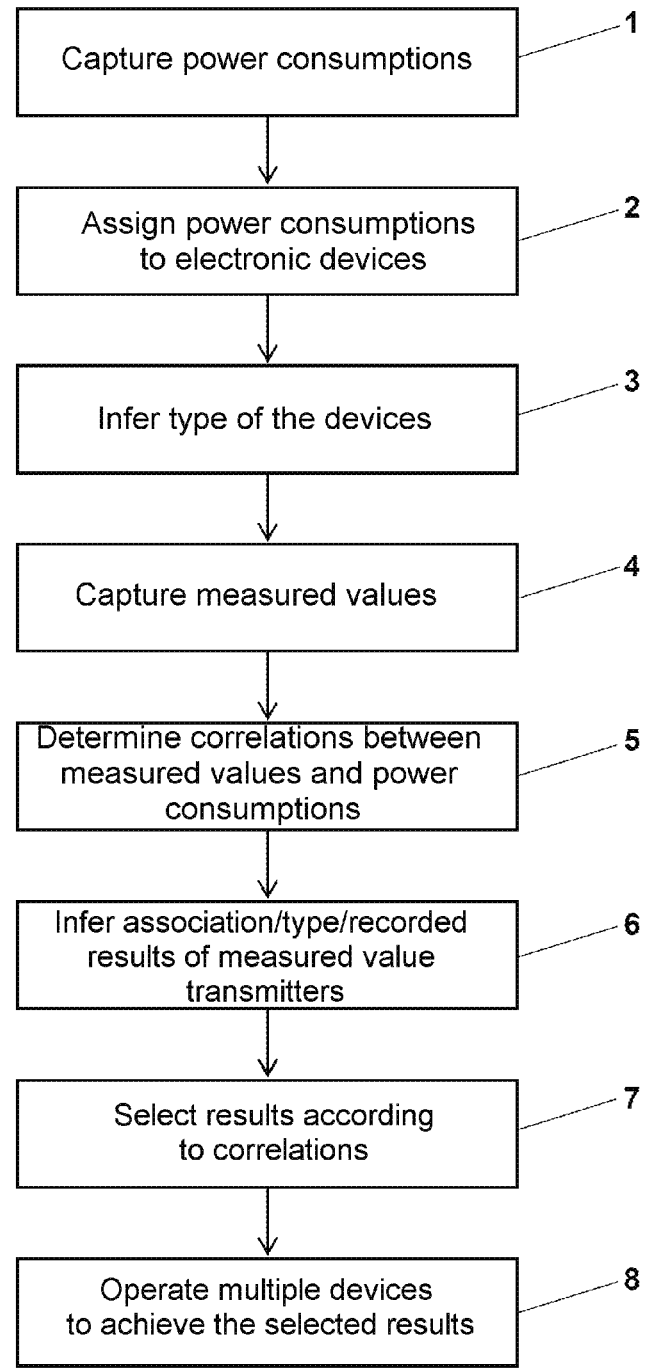
FIG. 1 is a flowchart for an embodiment of the method according to the disclosure.

The acts of the embodiment of the method according to the disclosure that is depicted on the basis of a flowchart in FIG. 1 do not necessarily take place in the order that emerges from FIG. 1. Rather, the order that emerges from FIG. 1 for the method according to the disclosure needs to be observed only for acts that are based directly on one another. Two acts are based on one another if one of the two acts first provides the bases for the other of the two acts, that is to say that the other act is not executable before the one act.

The acts of the method according to the disclosure that are indicated in FIG. 1 are executed centrally. This can mean that the steps are performed in a single central unit of an apparatus for performing the method according to the disclosure. However, centrally in this instance necessarily means only that the acts are performed for all involved electrical devices and measured value transmitters collectively. They do not have to be performed at a single location. Rather, individual acts of the method can be relocated from a local unit to a physically remote computing unit, for example. In particular, a local unit can access external databases, for example via the Internet, in order to perform the method according to the disclosure.

In a capture act 1, power consumptions of the electrical devices involved in the method according to the disclosure are captured. This capture can be effected such that the power consumptions of the individual electrical devices are captured directly, the power consumptions being directly associated with the individual electrical devices. The power consumptions can alternatively be captured by using a measuring device that captures the cumulated power consumptions of some or all electrical devices involved. The act of assigning 2 the power consumptions to the individual electrical devices is then more complex, but usually still possible. The power consumption, in particular, the time course thereof, is a characteristic of the respective electrical device and can therefore be used to assign the power consumption to the respective electrical device and to identify the respective electrical device. The power consumptions also permit inference 3 of the type of the respective electrical device where said type is not known from another source.

Furthermore, the method according to the disclosure involves capturing 4 measured values from measured value transmitters involved in the method according to the disclosure. The measured values of the measured value transmitters indicate results that are achieved by operating the electrical devices. In a determination act 5, correlations between time courses of the captured measured values and time courses of the captured power consumptions are determined. This actually involves determining a maximum degree of interrelation, in particular, a maximum correlation coefficient, which is obtained by taking into consideration various time delays between the time course of a power consumption of an individual electrical device and the time course of the measured values from an individual measured value transmitter. This degree of interrelation indicates the degree to which the operation of the respective electrical device influences the result indicated by the respective measured value.

Inferring 6 a spatial association of the measured value transmitters with the electrical devices, the type of the measured value transmitters and the results recorded by them forms a further basis for selecting 7 results that can be achieved particularly efficiently by operating multiple instances of the electrical devices in mutually coordinated fashion or that can actually be achieved by operating the electrical devices in mutually coordinated fashion. The subsequent operation 8 involves the operation of multiple electrical devices being coordinated with one another such that the selected results are achieved. These selected results can be, for example, a temperature captured by one of the measured value transmitters, a reactive power captured by one of the measured value transmitters, or an applicable phase angle or a pressure captured by one of the measured value transmitters.

Figure 2:
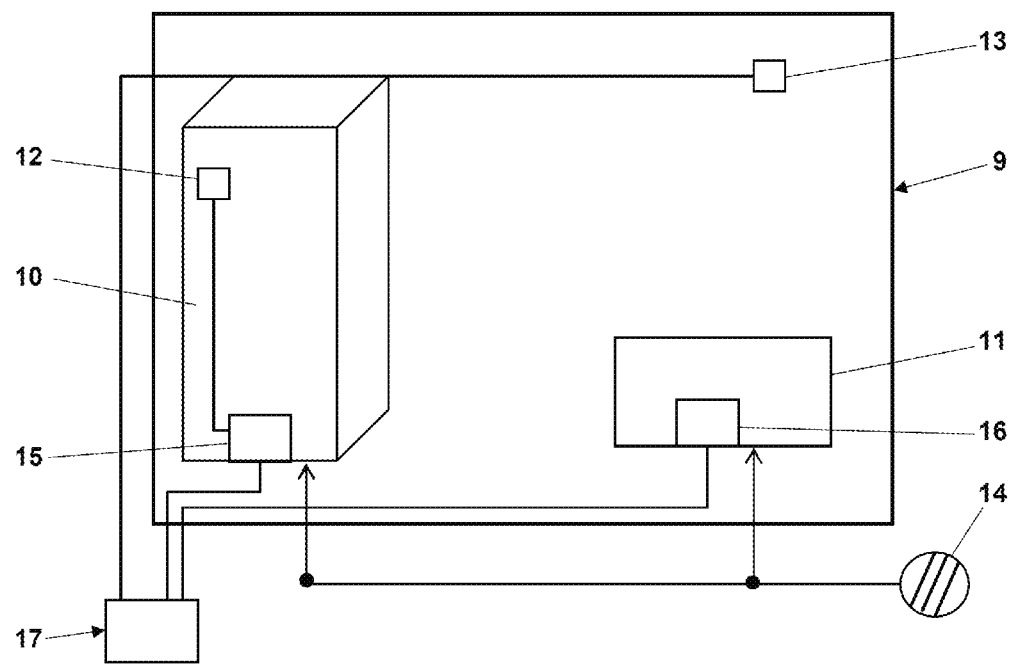
FIG. 2 illustrates a first concrete application of the method according to the disclosure.

FIG. 2 schematically shows a room 9 in which a refrigerator 10 and an electrical direct heater 11 are arranged as electrical devices. In the refrigerator 10 there is a temperature sensor 12 as measured value transmitter for the temperature in the refrigerator 10. Outside the refrigerator 10 and the electrical direct heater 11 there is a further temperature sensor 13 as a measured value transmitter for the room temperature in the room 9. The refrigerator 10 and the electrical direct heater 11 are supplied with electric power from an electricity grid 14. Power consumptions of the refrigerator 10 and the electrical direct heater 11 are recorded by control units 15 and 16 of these electrical devices and centrally captured by an apparatus 17 for performing the method according to the disclosure. In the apparatus 17, the measured values of the temperature sensor 13, i.e. the room temperature, are also captured. The control unit 15 of the refrigerator 10 can also be used by the apparatus 17 to capture the measured values of the temperature sensor 12, i.e. the temperature in the refrigerator 10. By determining correlations between the time courses of the measured values of the temperature sensor 13 and the time courses of the power consumptions of the refrigerator 10 and the electrical direct heater 11, the apparatus 17 detects that and how the operation of not only the electrical direct heater 11 but also the refrigerator 10 influences the room temperature.

Figure 3:
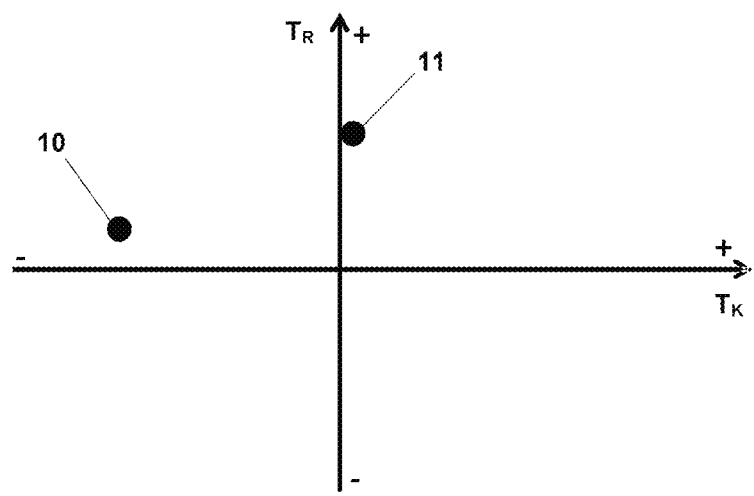
FIG. 3 is a graph for the application shown in FIG. 2.

FIG. 3 is a plot of degrees of interrelation between the operation of the refrigerator 10 and the electrical direct heater 11 and the room temperature TR, which is captured using the temperature sensor 13, and the temperature TK in the refrigerator 10, which is captured using the temperature sensor 12. The degrees of interrelation have been determined by determining 5 the correlations between the time courses of the measured values of the temperature sensors 12 and 13 and the time courses of the power consumption of the refrigerator 10 and the electrical direct heater 11. The degrees of interrelation indicate that the operation of the electrical direct heater 11 essentially leads only to a raising of the room temperature TR. The temperature TK in the refrigerator 10 is influenced only slightly by the electrical direct heater 11, however. The operation of the refrigerator 10, on the other hand, has the effect not only of lowering the temperature TK but also of significantly increasing the room temperature TR. Setting a desired room temperature TR as a desired result is then accomplished, according to the disclosure, by operating the refrigerator 10 and the electrical direct heater 11 in mutually coordinated fashion. To this end, actuating the electrical direct heater 11 involves taking into consideration the influence of the refrigerator 10 on the other result that the refrigerator 10 has for the room temperature TR when it is operated, which is originally done to achieve the desired result of a specific temperature TK in the refrigerator 10.

Figure 4:
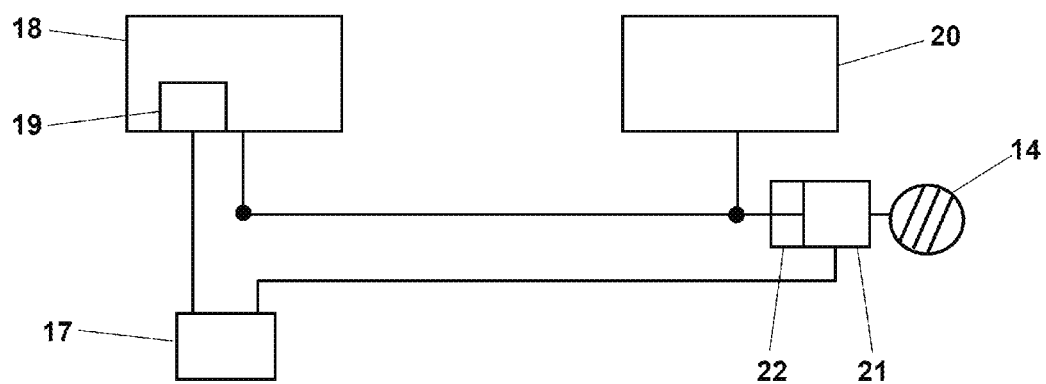
FIG. 4 explains a second application of the method according to the disclosure.

FIG. 4 schematically shows a PV inverter 18, having a control unit 19, and an electric motor 20, which are connected in parallel with one another to an electricity grid 14. Between the PV inverter 18 and the electric motor 20, on the one hand, and the electricity grid 14, on the other hand, there is an electricity meter 21 that records the power consumption of the electric motor 20 and the negative power consumption, i.e. the power feed, of the PV inverter 18. The power consumptions are captured by the apparatus 17, and they are assigned to the individual electrical devices 18 and 20. Moreover, the electricity meter 21 comprises a measured value transmitter 22, which captures the phase angle between current and voltage and hence the reactive power drawn from the grid 14. The measured value of the phase angle is analysed in the apparatus 17 for correlations with the power consumptions of the electrical devices 18 and 20. To set a desired phase angle or to provide reactive power for the electricity grid 14, the apparatus 17 acts on the controller 19 of the PV inverter 18 in order to operate the PV inverter 18 in a manner coordinated with the operation of the electric motor 20.

Figure 5:
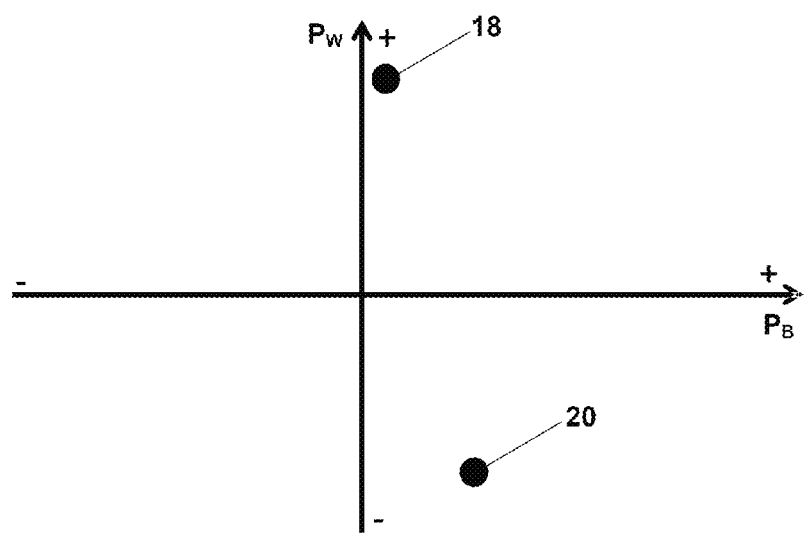
FIG. 5 is a graph for the application shown in FIG. 4.

FIG. 5 is a plot of the degrees of interrelation between the provision of real power PW and of reactive power PB during the operation of the PV inverter 18 and the electric motor 20. The electric motor 20 provides not only mechanical power, not considered here, which is the result primarily sought through the operation thereof, but also reactive power PB for the electricity grid 14 and consumes real power PW. The PV inverter essentially provides real power PW, but to a certain degree also reactive power PB. To provide a desired level of reactive power, the PV inverter 18 and the electric motor 20 are operated in mutually coordinated fashion, according to the disclosure, after the degrees of interrelation as shown in FIG. 5 have previously been determined by determining 5 the correlations and these have been used to determine the opportunity for coordinated operation in order to achieve the desired result of the provision of reactive power.

The invention claimed is:

1. A method for operating electrical devices, comprising:
capturing power consumptions of the electrical devices,
assigning captured power consumptions to the electrical devices individually, and
wherein a desired result of operation of at least some of the electrical devices is achieved by virtue of at least a first control instance of the at least a first of the electrical devices, the operation of which contributes to achieve the desired result, and a second control instance of at least a second of the electrical devices, the operation of which likewise contributes to achieve the desired result, being operated in mutually coordinated fashion,
capturing measured values from measured value transmitters individually, wherein the measured value transmitters record results that are achieved by operating the electrical devices,
determining correlations between changes in the individual measured values of the measured value transmitters over time and changes in the power consumptions of the electrical devices individually over time, and
wherein the desired result is selected from a subgroup of results which are recorded by the measured value transmitters and for which a correlation between changes in the measured values from at least one of the measured value transmitters over time and changes in power consumption of at least two of the electrical devices over time reach a first predetermined minimum correlation value.

2. The method according to claim 1, wherein dependencies of the determined correlations between changes in the measured values of individual measured value transmitters over time and changes in the power consumptions of the individual electrical devices over time on the measured values of other measured value transmitters are determined and taken into consideration in achieving the desired result.

3. The method according to claim 1, wherein correlations between changes in the measured values of the individual measured value transmitters over time and changes in the power consumptions of the individual electrical devices over time are used to infer an association of one or more of the individual measured value transmitters with one or more of the individual electrical devices.

4. The method according to claim 1, wherein the correlations between changes in the measured values of the individual measured value transmitters over time and changes in the power consumptions of the individual electrical devices over time are used to infer a type of the individual measured value transmitters and/or a type of results recorded by the individual measured value transmitters.

5. The method according to claim 1, wherein the determination of the correlations between changes in the measured values of the individual measured value transmitters over time and changes in the power consumptions of the individual electrical devices over time involves only such changes in the measured values of the individual measured value transmitters over time as keep to a predetermined minimum time delay and/or a predetermined maximum time delay in comparison with the changes in the power consumptions over time being taken into consideration.

6. The method according to claim 1, wherein the determined correlations between changes in the measured values of the individual measured value transmitters over time and changes in the power consumptions of the individual electrical devices over time are monitored over time for changes.

7. The method according to claim 6, further comprising outputting an inspection suggestion for the respective individual electrical device if changes reach a predetermined level of significance.

8. The method according to claim 1, wherein the desired result is selected from a subgroup of results that comprise a raising, a lowering or a setting of a temperature, a pressure and/or a reactive power.

9. The method according to claim 1, wherein the determined correlations are entered into a graphical representation of the electrical devices.

10. The method according to claim 1, wherein the capturing of power consumptions of the electrical devices is performed continually.

11. The method according to claim 1, wherein the capturing of power consumptions of the electrical devices is performed centrally at a single location.

12. The method according to claim 1, wherein the capturing of measured values from measured value transmitters is performed centrally at a single location.

13. An apparatus having a data input for connecting at least one power consumption signal and measured value transmitters and a control input for controlling multiple electrical devices, wherein the apparatus is configured to perform the method according to claim 1.

* * * * *